US010276299B2

(12) United States Patent
Aarab

(10) Patent No.: US 10,276,299 B2

(45) Date of Patent: Apr. 30, 2019

(54) ISOLATING ELEMENT FOR A TOROIDAL CORE INDUCTOR, AND TOROIDAL CORE INDUCTOR

(71) Applicant: Würth Elektronik eiSos GmbH & Co. KG, Waldenburg (DE)

(72) Inventor: Hassan Aarab, Flörsheim am Main (DE)

(73) Assignee: Würth Elektronik eiSos GmbH & Co. KG, Waldenburg (DE)

( * ) Notice: Subject to any disclaimer, the term of this patent is extended or adjusted under 35 U.S.C. 154(b) by 38 days.

(21) Appl. No.: 15/477,533

(22) Filed: Apr. 3, 2017

(65) Prior Publication Data

US 2017/0301459 A1 Oct. 19, 2017

(30) Foreign Application Priority Data

Apr. 13, 2016 (DE) ........................ 10 2016 206 171

(51) Int. Cl.

| | |
|---|---|
| ***G01R 15/18*** | (2006.01) |
| ***H01F 27/32*** | (2006.01) |
| ***H01F 17/06*** | (2006.01) |
| *H01F 27/06* | (2006.01) |

(Continued)

(52) U.S. Cl.

CPC ......... *H01F 27/324* (2013.01); *H01F 17/062* (2013.01); *H01F 17/06* (2013.01); *H01F 27/06* (2013.01); *H01F 30/16* (2013.01); *H01F 41/125* (2013.01)

(58) Field of Classification Search

CPC ........ H01F 27/324; H01F 27/06; H01F 17/06; H01F 17/062; H01F 30/16; H01F 41/125; H01F 41/06; H01F 5/04; G01B 7/003; G01B 7/12; G01B 7/14; G01B 3/205; G01B 3/20; G01P 3/488; G01D 5/2046; G01D 5/2266; G01D 5/2013; G01D 5/202; G01D 5/2033; G01D 5/2073; G01D 5/12;

(Continued)

(56) References Cited

U.S. PATENT DOCUMENTS

| | | | | |
|---|---|---|---|---|
| 3,374,452 | A | 3/1968 | Judd | |
| 4,833,436 | A | 5/1989 | Martin et al. | |
| 4,875,277 | A * | 10/1989 | Martin | H01F 27/306 29/463 |
| 6,690,257 | B2 * | 2/2004 | Kobayashi | H01F 17/062 336/192 |

(Continued)

FOREIGN PATENT DOCUMENTS

| | | |
|---|---|---|
| CN | 87106277 | 4/1988 |
| CN | 201622910 | 11/2010 |

(Continued)

OTHER PUBLICATIONS

Chinese Office Action dated Nov. 1, 2018.

*Primary Examiner* — Thang X Le

(74) *Attorney, Agent, or Firm* — Boyle Fredrickson, S.C.

(57) ABSTRACT

The invention relates to an isolating element for a toroidal core inductor, comprising a first isolating web part and a second isolating web part, which isolating web parts are provided with latching apparatuses which match one another and in each case with at least one retaining projection, wherein the retaining projections, in the mounted state of the isolating element, rest on a respective top side of the toroidal core inductor, and wherein, in the mounted state of the isolating element, the two isolating web parts extend at least in sections into a passage opening in the toroidal core inductor.

20 Claims, 4 Drawing Sheets

(51) Int. Cl.
*H01F 30/16* (2006.01)
*H01F 41/12* (2006.01)

(58) Field of Classification Search
CPC ............ G01D 5/20; G01D 5/22; G01D 5/249; G01D 5/2086
See application file for complete search history.

(56) References Cited

U.S. PATENT DOCUMENTS

| | | | | |
|---|---|---|---|---|
| 6,753,749 | B1 | 6/2004 | Chin | |
| 7,400,224 | B2 * | 7/2008 | Feist | H01F 17/062 336/206 |
| 7,479,865 | B2 | 1/2009 | Feist et al. | |
| 7,990,248 | B2 * | 8/2011 | Feist | H01F 30/16 336/206 |
| 8,841,985 | B2 | 9/2014 | Feist | |
| 2006/0192649 | A1 * | 8/2006 | Feth | H01F 17/062 336/229 |
| 2007/0202727 | A1 * | 8/2007 | Feist | H01F 17/062 439/246 |
| 2008/0084254 | A1 * | 4/2008 | Takahashi | H01F 17/062 333/184 |

FOREIGN PATENT DOCUMENTS

| | | | |
|---|---|---|---|
| DE | 3047603 | A1 | 7/1982 |
| DE | 102010031292 | A1 | 1/2012 |
| DE | 202013000695 | U1 | 1/2013 |
| EP | 0258592 | A1 | 3/1988 |

* cited by examiner

ISOLATING ELEMENT FOR A TOROIDAL CORE INDUCTOR, AND TOROIDAL CORE INDUCTOR

BACKGROUND

The invention relates to an isolating element for a toroidal core inductor, and to a toroidal core inductor comprising an isolating element.

In order to comply with the statutory guidelines in respect of potential isolation for electrically conductive parts, it is customary to use isolating webs composed of insulating material between the current-carrying parts in toroidal core inductors.

SUMMARY

German utility model DE 20 2013 000 695 U1 discloses an isolating element for a toroidal core inductor, which isolating element is intended to be pushed into a passage opening in a toroidal core of a toroidal core inductor. The isolating element consists of a plate-like material and has two slots which extend into the plate-like material from a first side edge and has a further slot which extends into the plate-like material on the opposite side edge. As a result, the three slots are arranged next to one another in plan view and the isolating element is elastically deformable parallel to its side edges. The isolating element is then slightly compressed and inserted into the passage opening in the toroidal core inductor. The isolating element then springs open and is then retained in the passage opening in the toroidal core inductor by means of said pres tress and by means of retaining lugs which are provided in an extension of the side edges. Owing to the slots which are provided in the isolating element, the windings of the toroidal core inductor are not isolated from one another by means of a continuous isolating wall.

German laid-open specification DS 10 2009 054 001 A1 discloses a further isolating element for a toroidal core inductor, which isolating element is of elastically resilient design and, in the mounted state, forms a continuous isolating wall in the passage opening in the toroidal core inductor between the two windings.

A further isolating element for a toroidal core inductor is known from European laid-open specification EP 0 256 592 A1. A certain degree of elasticity and spring action of the isolating wall is achieved owing to a toroidal design of the isolating element in its central region.

A further isolating element for a toroidal core inductor is known from German laid-open specification DE 30 47 603 A1. The isolating element consists of plate-like material and has slots in order to achieve a certain degree of elasticity and spring action of the isolating element.

German laid-open specification DE 10 2010 031 292 A1 discloses a holder for a toroidal core inductor, which holder can act as an isolating element at the same time. To this end, the holder has two spring-action arms which are arranged as limbs of a U and which are then pushed into the passage opening in the toroidal core coil.

International laid-open specification WO 2006/133671 A1 discloses an isolating element for a toroidal core inductor, which isolating element is of star-shaped design in plan view and can form isolation in star between a total of three windings which are fitted, on the toroidal core of the toroidal core inductor. The isolating element is provided, on its side faces, with latching devices which can latch into grooves in a retaining device. As a result, the isolating element serves as a fastening apparatus for the toroidal core coil on the. holder at the same time.

The objective of the invention is to improve an isolating element for a toroidal core inductor and a toroidal core inductor.

According to the invention, an isolating element for a toroidal core inductor having the features of Claim 1 and a toroidal core inductor having the features according to Claim 13 are provided for this purpose.

The isolating element according to the invention has a first isolating web part and a second isolating web part, the said isolating web parts being provided with latching apparatuses which match one another and with in each case at least one retaining projection, wherein the retaining projections, in the mounted state of the isolating element, rest on a respective top side of the toroidal core inductor, and wherein, in the mounted state of the isolating element, the two isolating web parts extend at least in sections into a passage opening in the toroidal core inductor.

Owing to the two-part construction of the isolating element and the connection of the two isolating web parts by way of latching apparatuses, the isolating element can be retained in a particularly stable manner in the toroidal core inductor, and therefore temperature changes and resulting changes in the dimensions of the passage opening in the toroidal core inductor and also in the isolating element itself do not lead to the isolating element being seated in the toroidal core inductor with play. Instead, owing to the two-part construction and the latching apparatuses, the said isolating element sits in a fixed manner with a slight prestress between the isolating web parts, and therefore firstly manufacturing tolerances and secondly also fluctuations in the dimensions caused by changes in temperature can be compensated for. Since the two isolating web parts each have at least one retaining projection which rests on a respective top side of the toroidal core inductor, it is possible to generate and maintain a prestress between the two isolating web parts. Furthermore, the retaining webs also ensure reliable potential isolation between windings of the toroidal core inductor on a top side of the toroidal core inductor. Since the two isolating web parts extend into a passage opening in the toroidal core inductor at least in sections, the dimensions of the completely mounted toroidal core inductor can be kept compact and, in particular, it is not necessary for one of the isolating web parts to protrude to a considerable extent beyond the windings on the toroidal core of the toroidal core inductor.

In a development of the invention, the latching apparatuses can be latched one into the other by means of a relative movement of the two isolating web parts, wherein the relative movement takes place parallel to a centre axis of the passage opening in the toroidal core inductor and/or about the centre axis.

The two isolating web parts are expediently pushed one into the other parallel to a centre axis of the passage opening and as a result are also latched. As an alternative or in addition, the two isolating web parts are rotated relative to one another.

In a development of the invention, the first isolating web part has a length which corresponds at least to the length of the passage opening in the toroidal core inductor, and the second isolating web part has an isolating section without apertures, which isolating section, in the mounted state, is arranged within the passage opening in the toroidal core inductor.

In this way, a continuous isolating wall without apertures can be achieved within the passage opening between the windings of the toroidal core inductor by the second isolating web part.

In a development of the invention, the first isolating web part has a receiving channel for the second isolating web part.

In this way, the second isolating web part can be received in the receiving channel in sections and secure latching is facilitated.

In a development of the invention, a latching apparatus of the first isolating web part is arranged within the receiving channel.

A compact design, with smooth outer sides of the first isolating web part and of the isolating element overall can be achieved in this way.

In a development of the invention, the receiving channel extends over the entire length of the first isolating web part. Providing a receiving channel, which forms a passage opening through the first isolating web part, facilitates production of the first isolating web part, for example from plastic injection moulding. However, furthermore, this also makes it possible to check for correct latching of the second isolating web part in the receiving channel of the first isolating web part. This can be performed by visual or tactile checking of this latching, which checking is possible on account of the receiving channel extending over the entire length of the first isolating web part and, as a result, also making it possible to inspect the interior of the receiving channel from that side which is situated opposite the second isolating web part. Visual or tactile checking for correct latching of this kind can, for example, also be performed in an automated manner.

In a development of the invention, the receiving channel has a rectangular cross section.

A compact design both of the first and of the second isolating web part can be achieved in this way.

In a development of the invention, the first isolating web part, and/or the second isolating web part have/has a main body which is in the form of a straight strip, wherein the two free end regions of the strip each form a retaining projection, wherein the retaining projections, in the mounted state of the isolating element, rest on a top side of the toroidal core inductor.

The isolating element can also be securely fixed in the longitudinal direction of the passage opening of the toroidal core inductor by means of retaining projections of this kind. A prestress can also be maintained between the first isolating web part and the second isolating web part, the said prestress ensuring the isolating element sits in the passage opening in the toroidal core inductor in a secure manner without play.

In a development of the invention, the second isolating web part has a main body and at least one latching arm which extends starting from the main body, wherein the at least one latching arm is provided with the latching apparatus.

In a development of the invention, two latching arms are provided, the said latching arms forming a U-shaped arrangement and each being provided with a latching projection and/or a latching recess.

A spring-action design of the two latching arms can be realized in a very simple manner by means of a U-shaped arrangement of this kind.

In a development of the invention, the first isolating web part and/or the second isolating web part are of slightly elastically deformable design at least in the region of the respective retaining projections, and therefore the respective retaining projections, in the mounted state of the isolating element, rest on the respective top side of the toroidal core inductor with a prestressing force.

A prestressing force between the first isolating web part and the second isolating web part can be achieved and maintained in the mounted state in this way.

In a development of the invention, the latching apparatuses are formed on the first isolating web part and on the second isolating web part such that the latching apparatuses, in the latched-in state, cannot be disconnected from one another without being destroyed.

As a result, it is possible to ensure that the two isolating web parts do not accidentally become detached from one another, for example during transportation of the completely mounted toroidal core inductors or else during mounting of the toroidal core inductor in an electronic circuit.

The problem on which the invention is based is also solved by a toroidal core inductor comprising an isolating element according to the invention, wherein a toroidal core of the toroidal core inductor has a central passage opening, and wherein the isolating element is inserted into the passage opening between different windings on the toroidal core.

In a development of the invention, the isolating element has retaining projections which rest on the top sides of the toroidal core.

BRIEF DESCRIPTION OF THE DRAWINGS

Further features and advantages of the invention can be found, in the claims and the following description of a preferred embodiment of the invention in conjunction with the drawings, in which:

The illustration of FIG. 1 shows an isolating element 10 according to the invention which, see FIG. 8 and FIG. 9, is intended to be inserted into a passage opening in a toroidal core inductor in order to achieve potential isolation between different windings on the toroidal core of a toroidal core inductor in this way.

Figure 1:
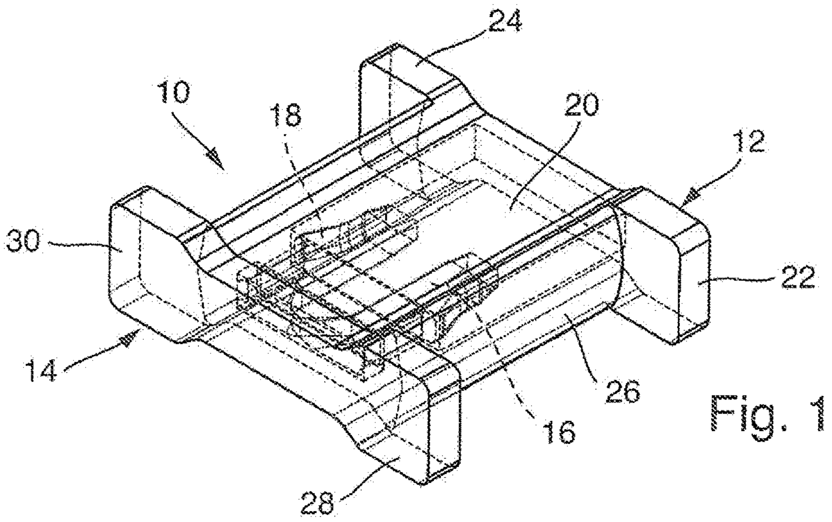
FIG. 1 shows a view of an isolating element according to the invention in line with a preferred embodiment in the inserted state, wherein boundary lines, which are actually concealed, are illustrated using dashed lines for explanatory purposes.

The isolating element 10 has a first isolating web part 12 and a second isolating web part 14, which isolating web parts are inserted one into the other in the state of FIG. 1. This is shown in FIG. 1 merely by way of the latching arms 16, 18, illustrated using dashed lines, of the second isolating web part, which latching arms extend into a receiving channel 20, likewise illustrated using dashed lines, in the first isolating web part 12. As a result, the second isolating web part 14 is latched to the first isolating web part 12. As a result, the two isolating web parts 12, 14 form an isolating element with an H-like shape.

Figure 8:
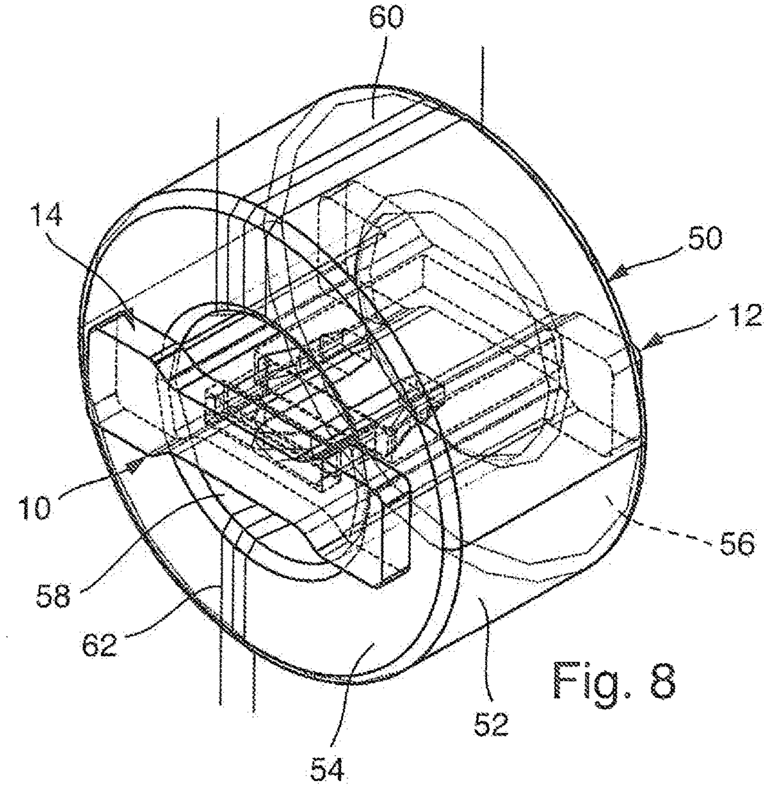
FIG. 8 shows a view of a toroidal core inductor according to the invention comprising the isolating element of FIG. 1 in a view obliquely from above.
Figure 9:
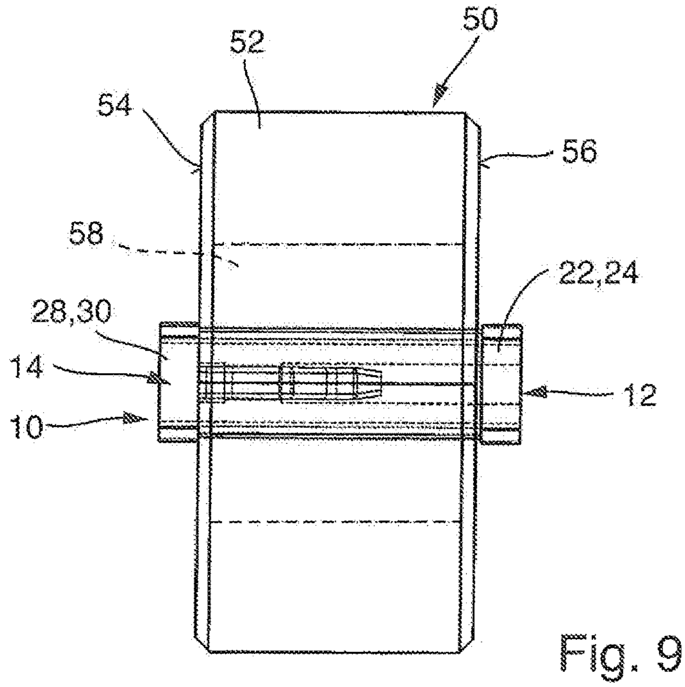
FIG. 9 shows a side view of the toroidal core inductor of FIG. 8.

The first isolating web part 12 has a strip-like main body, wherein the two free ends of the strip each form a retaining projection 22, 24 which, in the mounted state of the isolating element, see FIG. 8 and FIG. 9, rest on a top side of the toroidal core of a toroidal core inductor.

An isolating wall section 26, which surrounds the receiving channel 20, starts from the main body with the retaining projections 22, 24. A length of the isolating wall section 26 corresponds, see FIG. 8 and FIG. 9, to the length of a passage opening in a toroidal core inductor for which the isolating element 10 is provided. As a result, a continuous isolating wall without apertures, which reliably isolates the different windings on the toroidal core inductor from one another, can be realized within the passage opening in the toroidal core inductor by means of the isolating wall section 26.

The second isolating web part 14 likewise has a main body in the form of a strip, the free ends of the said strip forming retaining sections 28, 30. The shape of the retaining sections 28, 30 corresponds to the shape of the retaining sections 22, 24 and, in the state in which they are latched one in the other, the retaining sections 22, 28 and the retaining sections 24, 30 are situated opposite one another.

In the mounted state of the isolating element 10, see FIG. 8 and FIG. 9, the retaining sections 22, 24 of the first isolating web part 12 rest on a first surface of the toroidal core of the toroidal core inductor, and the retaining sections 28, 30 rest on the opposite top side of the toroidal core of the toroidal core inductor. As a result, reliable isolation between different windings of the toroidal core inductor can be realized both in the region of the two top sides of the toroidal core and also within the passage opening in the toroidal core by means of the isolating element 10. The two isolating web parts 12, 14 are each integrally produced from plastic, in particular by means of plastic injection moulding.

Figure 2:
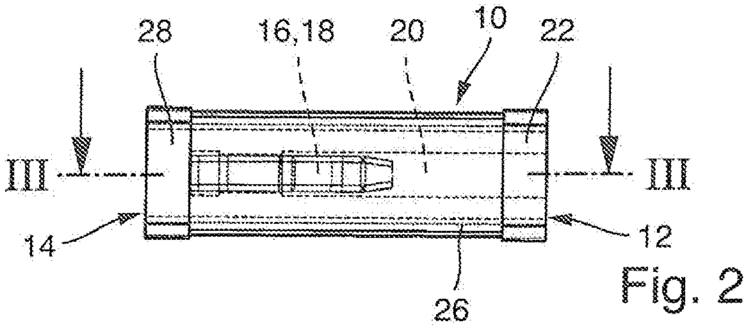
FIG. 2 shows a side view of the isolating element of FIG. 1, wherein boundary lines, which are again actually concealed, are illustrated using dashed lines for explanatory purposes.

The illustration of FIG. 2 shows the isolating element 10 of FIG. 2 in a side view. Once again, boundary lines, which are actually concealed, are illustrated using dashed lines and therefore can also be seen in the side view of the receiving channel 20 and the latching arms 16, 18 which extend into the receiving channel. The isolating wall section 26 lies between the main bodies of the isolating web parts 12, 14. The retaining sections 22, 28 and, respectively, 24, 30 have facing boundary areas which are each of planar design. As a result, the retaining sections 22, 28 and, respectively, 24, 30 can rest flat on the toroidal core of the toroidal core inductor by way of these boundary areas, see FIG. 8 and FIG. 9. A differing design of these areas is expedient, for example, when the toroidal core of the toroidal core inductor does not have any planar top sides.

Figure 3:
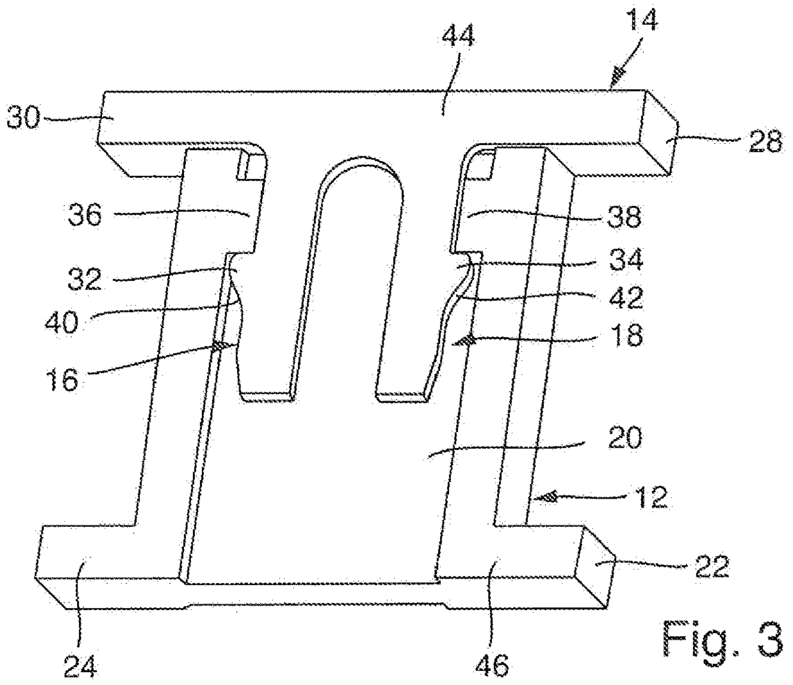
FIG. 3 shows a side view along sectional plane III-III in FIG. 2.

The illustration of FIG. 3 shows a sectional view along sectional plane III-III in FIG. 2. It can clearly be seen in this sectional view that the two latching arms 16, 18 of the second isolating web part 14 extend into the receiving channel 20 of the first isolating web part 12. The two latching arms 16, 18 are arranged parallel to one another and have a U-shaped recess between them. As a result, the latching arms 16, 18 can spring slightly inward, that is to say toward one another. Each of the latching arms 16, 18 is provided with a latching apparatus in the form of a latching projection 32 and, respectively, 34. In the state of FIG. 3, in which the second isolating web part 14 is pushed completely into the receiving channel 20 of the first isolating web part 12, the latching projections 32, 34 each engage behind a latching projection 36 and, respectively, 38 on the first isolating web part 12, wherein the latching projections 36, 38 protrude into the free cross section of the receiving channel 20.

The latching projections 32, 34 each have, in the direction of the free end of the latching arms 16, 18, a run-on bevel 40 and, respectively, 42. However, on the opposite side of the latching projections 32, 34, the said latching projections have a stop face which runs perpendicular to the respective latching arm 16, 18. Therefore, when the second isolating web part 14 is pushed into the receiving channel 20 of the first isolating web part 12, the run-on bevels 40, 42 reach the region of the latching projections 36, 38 in the receiving channel 20. When the second isolating web part 14 is advanced further into the receiving channel 20, the latching arms 16, 18 are deflected inwards, that is to say towards one another, as a result. The latching projections 32, 34 can be pushed past the latching projections 36, 38 of the receiving channel 20 until the latching projections 32, 34 on the latching arms 16, 18 are behind the latching projections 36, 38 of the receiving channel 20. The latching arms 16, 18 then immediately spring open, so that they assume the position illustrated in FIG. 3. The second isolating web part 14 is then reliably secured on the first isolating web part 12. In this case, the prestress of the latching arms 16, 18 is selected to be such that, starting from the latched state in FIG. 3, the first isolating web part 12 and the second isolating web part 14 cannot be detached from one another again without being destroyed. In this case, a distance of the latching lugs 32, 34 on the latching arms 16, 18 from the main body 44 of the second isolating web part or a distance of the latching projections 36, 38 of the first isolating web part from the main body 46 of the first isolating web part 12 is such that, in the mounted state of the isolating element 10, see FIG. 8 and FIG. 9, the retaining projections 22, 24, 28, 30 each rest on the respective top side of the toroidal core of the toroidal core inductor with a prestress. As a result, tolerances of the isolating element 10, of the toroidal core of the toroidal core inductor and also temperature-related changes in size of the individual components can be compensated for. In order to maintain a prestress of this kind, the first isolating web part 12 is of slightly spring-elastic design in the region of the retaining sections 22, 24 and the second isolating web part 14 is of slightly spring-elastic design in the region of the retaining projections 28, 30.

It can also be seen from the illustration of FIG. 3 that the receiving channel 20 extends over the entire length of the first isolating web part 12. As a result, the second isolating web part 14 can be pushed into the receiving channel 20 from the opening in the receiving channel 20 which is situated at the top in FIG. 3. Visual checking as to whether the two latching arms 16, 18 are correctly snapped behind the latching projections 36, 38 in the receiving channel 20 can then be performed from the opposite side of the receiving channel 20, which is situated at the bottom in FIG. 3. As a result, it is possible to visually check in a simple manner whether the second isolating web part 14 is correctly fastened to the first isolating web part 12. In addition to a visual check, a check of this kind could also be made, for example, by means of a mechanical sensor which then extends into the recess between the two latching arms 16, 18.

It is essential that checking for correct latching between the first isolating web part 12 and the second isolating web part 14 can actually be performed and that checking for correct latching of this kind can also be performed in a fully automated manner.

Figure 4:
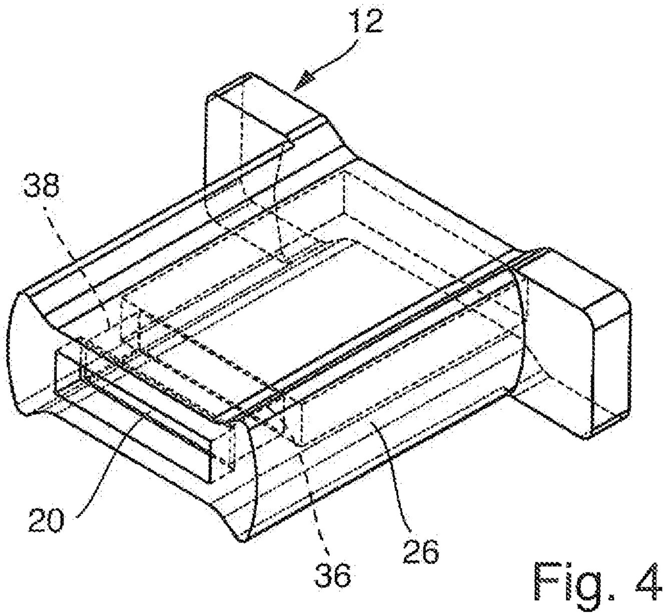
FIG. 4 shows a view of the first isolating web part of the isolating element of FIG. 1 in a view obliquely from above.

The illustration of FIG. 4 shows the first isolating web part 12 in a view obliquely from above. Boundary lines, which are actually concealed, are once again illustrated using dashed lines. It can be seen that the isolating section has a bone-like cross-sectional shape. A height of the isolating wail section 26 is constant in the region of the opening, which faces the viewer in FIG. 4, of the receiving channel 20. The height of the isolating wall section 26 then respectively increases in the direction of the opposite ends of the isolating wall section 26. It can also be seen that the receiving channel 20 has a rectangular cross section and that the free cross section of the receiving channel 20 is constricted by the two latching projections 36, 38. The first isolating web part 12 can advantageously be produced from plastic, for example by means of plastic injection moulding.

Figure 5:
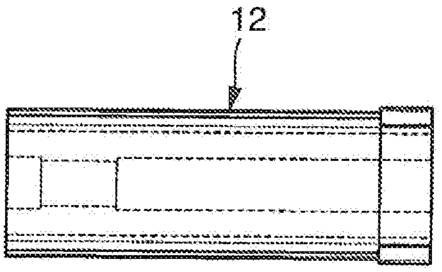
FIG. 5 shows a side view of the first isolating web part of FIG. 4.

The illustration of FIG. 5 shows a side view of the first isolating web part 12 of FIG. 4.

Figure 6:
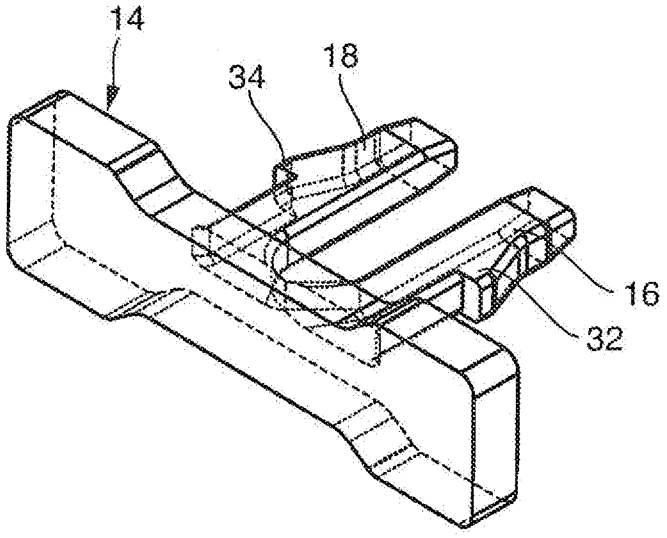
FIG. 6 shows a view of the second isolating web part of the isolating element of FIG. 1 obliquely from above.

The illustration of FIG. 6 shows the second isolating web part 14 in a view obliquely from above. The approximately U-shaped arrangement of the two latching arms 16, 18 and the design of the latching projections 32, 34 on the respective latching arm 16, 18 can be seen in the said figure.

Figure 7:
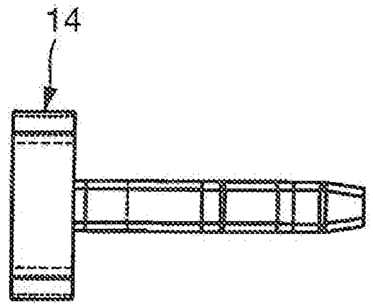
FIG. 7 shows a side view of the second isolating web part of FIG. 6.

The illustration of FIG. 7 shows a side view of the second isolating web part 14 of FIG. 6.

The illustration of FIG. 8 shows a toroidal core inductor 50 according to the invention in a view obliquely from above, wherein boundary lines, which are again actually not visible, are illustrated using dashed lines. The toroidal core inductor 50 has a toroidal core 52 which is in the form of a tubular section with planar top sides 54, 56, also see FIG. 9. The toroidal core 52 has a central passage opening 58 into which the isolating element 10 is pushed in. As a result, the isolating element 10 is fastened to the toroidal core 52 with a slight prestress when the first isolating web part 12 and the second isolating web part 14 are pushed one into the other and are latched to one another. As a result, the isolating element 10 ensures reliable potential isolation between a first winding 60, only schematically illustrated in FIG. 8, and a second winding 62, likewise only schematically illustrated, on the toroidal core 52 of the toroidal core inductor 50.

The illustration of FIG. 9 shows the toroidal core inductor 50 of FIG. 8 in a side view. The isolating element 10 is secured in the passage opening 58 in the toroidal core 52 of the toroidal core inductor 50, and the retaining sections 22, 24 of the first isolating web part 12 rest flat on the top side 56 of the toroidal core 52, and the retaining sections 28, 30 of the second isolating web part 14 rest flat on the opposite top side 54 of the toroidal core 52. As a result, reliable isolation between the two windings 60, 62, which are not illustrated in FIG. 9 for reasons of clarity, is also achieved in the region of the two top sides 54, 56.

As a result, very reliable potential isolation between windings 60, 62 of a toroidal core inductor 50 can be achieved by virtue of the invention, wherein the isolating element 10 provides a continuous isolating wall without apertures in the region of the passage opening 58 of the toroidal core 52. Particularly reliable and simple mounting of the isolating element 10 can be achieved since the isolating element 10 consists of two .isolating web parts 12, 14 which are latched, one into the other. Correct latching of the two isolating web parts 12, 14 with respect to one another can also be checked in an automated manner in the mounted state.

The invention claimed is:

1. An isolating element for a toroidal core inductor, comprising a first isolating web part; and a second isolating web part, wherein the first and second isolating web parts are provided with latching apparatuses which match one another and each of the first and second isolating web parts having at least one retaining projection, wherein the retaining projections, in the mounted state of the isolating element, rest on a respective top side of the toroidal core inductor, wherein, in the mounted state of the isolating element, the first and second isolating web parts extend, at least in part, into a passage opening in the toroidal core inductor, wherein the latching apparatuses can be latched into one another by mean of a relative movement of the two isolating web parts, and wherein the relative movement takes place parallel to a centre axis and/or about a centre axis of the passage opening in the toroidal core inductor.

2. The isolating element according to claim 1, wherein the first isolating web part has a length which corresponds at least to the length of the passage opening in the toroidal core inductor, and in that the first isolating web part has an isolating wall section without apertures, which isolating wall section, in the mounted state, is arranged within the passage opening in the toroidal core inductor.

3. The isolating element according to claim 1, wherein the first isolating web part has a receiving channel for receiving the second isolating web part.

4. The isolating element according to claim 3, wherein a latching apparatus of the first isolating web part is arranged within the receiving channel.

5. The isolating element according to claim 3, wherein the receiving channel extends over the entire length of the first isolating web part.

6. The isolating element according to claim 5, wherein the receiving channel has a rectangular cross section.

7. The isolating element according to claim 1, wherein the first isolating web part and/or the second isolating web part have/has a main body which is in the form of a straight strip, wherein the two free end regions of the strip each form a retaining projection, wherein the retaining projections, in the mounted state of the isolating element, rest on a top side of the toroidal core inductor.

8. The isolating element according to claim 1, wherein the second isolating web part has main body and at least one latching arm which extends starting from the main body, wherein the at least one latching arm is provided with the latching apparatus.

9. The isolating element according to claim 8, wherein two latching arms are provided, the said latching arms forming a U-shaped arrangement and each being provided with a latching projection and/or a latching recess.

10. The isolating element according to claim 1, wherein the first isolating web part and/or the second isolating web part are of slightly elastically deformable design at least in the region of the respective retaining projections, and therefore the respective retaining projections, in the mounted state of the isolating element, rest on the respective top side of the toroidal core inductor with a prestressing force.

11. The isolating element to claim 1, wherein the latching apparatuses are formed on the first isolating web part and on the second isolating web part such that the latching apparatuses, in the latched-in state, cannot be disconnected from one another without being destroyed.

12. A toroidal core inductor comprising an isolating element according to claim 1, wherein a toroidal core of the toroidal core inductor has a central passage opening, and wherein the isolating element is inserted into the passage opening between different windings on the toroidal core.

13. The toroidal core inductor according to claim 12, wherein the isolating element has retaining projections which rest on the top sides of the toroidal core.

14. An isolating element for a toroidal core inductor, comprising a first isolating web part; and a second isolating web part, wherein the first and second isolating web parts are provided with latching apparatuses which match one another and each of the first and second isolating web parts having at least one retaining projection, wherein the retaining projections, in the mounted state of the isolating element, rest on a respective top side of the toroidal core inductor, wherein, in the mounted state of the isolating element, the first and second isolating web parts extend, at least in part, into a passage opening in the toroidal core inductor, wherein the first isolating web part has a receiving channel for receiving the second isolating web part, and wherein a latching apparatus of the first isolating web part is arranged within the receiving channel.

15. The isolating element according to claim 14, wherein the first isolating web part has a length which corresponds at least to the length of the passage opening in the toroidal core inductor, and in that the first isolating web part has an isolating wall section without apertures, which isolating wall section, in the mounted state, is arranged within the passage opening in the toroidal core inductor.

16. The isolating element according to claim 14, wherein the first isolating web part and/or the second isolating web part are of slightly elastically deformable design at least in the region of the respective retaining projections, and therefore the respective retaining projections, in the mounted state of the isolating element, rest on the respective top side of the toroidal core inductor with a prestressing force.

17. The isolating element to claim 14, wherein the latching apparatuses are formed on the first isolating web part and on the second isolating web part such that the latching apparatuses, in the latched-in state, cannot be disconnected from one another without being destroyed.

18. An isolating element for a toroidal core inductor, comprising a first isolating web part; and a second isolating web part, wherein the first and second isolating web parts are provided with latching apparatuses which match one another and each of the first and second isolating web parts having at least one retaining projection, wherein the retaining projections, in the mounted state of the isolating element, rest on a respective top side of the toroidal core inductor, wherein, in the mounted state of the isolating element, the first and second isolating web parts extend, at least in part, into a passage opening in the toroidal core inductor, wherein the second isolating web part has a main body and at least one latching arm which extends starting from the main body, wherein the at least one latching arm is provided with the latching apparatus, and wherein two latching arms are provided, the said latching arms forming a U-shaped arrangement and each being provided with a latching projection and/or a latching recess.

19. The isolating element according to claim 18, wherein the first isolating web part has a length which corresponds at least to the length of the passage opening in the toroidal core inductor, and in that the first isolating web part has an isolating wall section without apertures, which isolating wall section, in the mounted state, is arranged within the passage opening in the toroidal core inductor.

20. The isolating element according to claim 18, wherein the first isolating web part and/or the second isolating web part have/has a main body which is in the form of a straight strip, wherein the two free end regions of the strip each form a retaining projection, wherein the retaining projections, in the mounted state of the isolating element, rest on a top side of the toroidal core inductor.

* * * * *